(12) United States Patent
Kang

(10) Patent No.: US 9,420,719 B2
(45) Date of Patent: Aug. 16, 2016

(54) SLICE-IO HOUSING WITH SIDE VENTILATION

(71) Applicant: Soon Seng Kang, Singapore (SG)

(72) Inventor: Soon Seng Kang, Singapore (SG)

(73) Assignee: Rockwell Automation Asia Pacific Business Ctr. Pte., Ltd., Singapore (SG)

( * ) Notice: Subject to any disclaimer, the term of this patent is extended or adjusted under 35 U.S.C. 154(b) by 151 days.

(21) Appl. No.: 14/190,726

(22) Filed: Feb. 26, 2014

(65) Prior Publication Data

US 2015/0181758 A1    Jun. 25, 2015

(30) Foreign Application Priority Data

Dec. 19, 2013   (SG) ............................... 201309439-6

(51) Int. Cl.
*H05K 7/20* (2006.01)
*H05K 7/14* (2006.01)
(Continued)

(52) U.S. Cl.
CPC .......... *H05K 7/20127* (2013.01); *H05K 5/0213* (2013.01); *H05K 7/1468* (2013.01); *H05K 7/1469* (2013.01); *Y10T 29/49826* (2015.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........................ 361/676–678, 679.46–679.54, 361/688–723, 756, 741, 686, 687, 725, 787, 361/789, 794, 807–810; 165/80.1–80.5, 165/104.33, 185; 174/15.1–15.3, 174/16.1–16.3, 547, 548; 257/712–722, 257/E23.088; 24/453, 458–459; 454/184; 312/236; 348/787, 789, 794; 349/56–60
See application file for complete search history.

(56) References Cited

U.S. PATENT DOCUMENTS 4,472,764 A    9/1984   Richard et al.
4,985,803 A    1/1991   Pum et al.
(Continued)

FOREIGN PATENT DOCUMENTS

DE         89 10 111 U1      10/1989
DE    10 2011 110 182 a1      2/2013
(Continued)

OTHER PUBLICATIONS

European Search Report, dated Mar. 16, 2016, in connection with EP 14198080.5, filed Dec. 16, 2014.
(Continued)

*Primary Examiner* — Anthony Haughton
*Assistant Examiner* — Razmeen Gafur
(74) *Attorney, Agent, or Firm* — Fay Sharpe LLP

(57) ABSTRACT

An input/output (I/O) device having a base portion configured to communicatively connect the I/O device with at least one other device, an I/O module physically and communicatively connected to the base portion and comprising I/O communication circuitry and a terminal block mount surface, and a terminal block physically and communicatively connected to the terminal block mount surface of the I/O module. The terminal block mount surface has a width that is greater than a corresponding width of the terminal block such that a portion of the terminal block mount surface extends beyond the terminal block, said portion of the terminal block mount surface extending beyond the terminal block including at least one vent for permitting the flow of air through the I/O module and along the terminal block.

12 Claims, 4 Drawing Sheets

(51) Int. Cl.
*H05K 5/02* (2006.01)
*H01L 23/473* (2006.01)

(56) References Cited

U.S. PATENT DOCUMENTS

| | | | |
|---|---|---|---|
| 5,229,922 A | 7/1993 | Muramatsu et al. | |
| 5,716,241 A * | 2/1998 | Hennemann | G06F 1/184 439/716 |
| 6,016,523 A * | 1/2000 | Zimmerman | G05B 19/054 710/303 |
| 6,402,569 B1 * | 6/2002 | Spadoni | H01R 9/2466 439/723 |
| 6,430,054 B1 * | 8/2002 | Iwata | H05K 7/026 174/560 |
| 6,443,783 B1 * | 9/2002 | Beadle | H01R 9/2425 439/718 |
| 6,672,914 B1 * | 1/2004 | Claprood | H01R 25/14 439/876 |
| 2001/0021608 A1 * | 9/2001 | Borbolla | H01R 13/6477 439/676 |
| 2002/0050375 A1 * | 5/2002 | Sumida | B60R 16/0238 174/50 |
| 2002/0064976 A1 * | 5/2002 | Saito | B60R 16/0238 439/76.2 |
| 2002/0166690 A1 * | 11/2002 | Chiriku | H02G 3/08 174/60 |
| 2002/0168882 A1 * | 11/2002 | Chiriku | H01R 12/58 439/76.2 |
| 2003/0174465 A1 * | 9/2003 | Isozumi | H05K 7/1432 361/688 |
| 2004/0218317 A1 * | 11/2004 | Kawazu | G05B 19/058 361/1 |
| 2006/0256508 A1 * | 11/2006 | Kim | H05K 7/1457 361/622 |
| 2007/0073912 A1 * | 3/2007 | Ozakl | G05B 19/054 710/8 |
| 2007/0173079 A1 * | 7/2007 | Kumar | G05B 19/054 439/50 |
| 2008/0049476 A1 * | 2/2008 | Azuma | B60L 3/12 363/131 |
| 2008/0266810 A1 | 10/2008 | Tiedemann et al. | |
| 2009/0085722 A1 * | 4/2009 | Fujita | H04Q 9/00 340/10.1 |
| 2010/0097759 A1 * | 4/2010 | Leinen | H01H 9/047 361/694 |
| 2010/0124029 A1 * | 5/2010 | Gaub | G05B 19/042 361/736 |
| 2010/0321889 A1 * | 12/2010 | Yoshino | H05K 7/20927 361/702 |
| 2011/0058337 A1 * | 3/2011 | Han | H02S 40/34 361/717 |
| 2011/0188174 A1 * | 8/2011 | Simper | H05K 7/1457 361/676 |
| 2011/0194247 A1 * | 8/2011 | Nakasaka | H01L 23/4093 361/689 |
| 2011/0194249 A1 * | 8/2011 | Nakasaka | H01L 23/473 361/689 |
| 2011/0273844 A1 * | 11/2011 | Rivera Hernandez | H05K 7/1471 361/692 |
| 2012/0024803 A1 * | 2/2012 | Replogle | H04Q 1/09 211/26 |
| 2012/0044083 A1 | 2/2012 | Molnar et al. | |
| 2012/0169257 A1 * | 7/2012 | Brereton | H05K 7/209 318/139 |
| 2012/0188712 A1 * | 7/2012 | Ishibashi | H02M 7/003 361/688 |
| 2012/0199373 A1 * | 8/2012 | Uchida | B60R 16/0238 174/50 |

FOREIGN PATENT DOCUMENTS

| | | |
|---|---|---|
| EP | 0 200 516 | 11/1986 |
| EP | 1524890 A1 | 4/2005 |
| GB | 2223884 | 4/1990 |
| JP | 2000222007 | 8/2000 |
| WO | WO 2013/166494 | 11/2013 |

OTHER PUBLICATIONS

Search report, dated Apr. 10, 2015, issued by Intellectual Property Office of Singapore in connection with Appln. No. 201309439-6, filed Dec. 19, 2013.

* cited by examiner

SLICE-IO HOUSING WITH SIDE VENTILATION

CROSS REFERENCE TO RELATED PATENTS AND APPLICATIONS

This application claims priority to and the benefit of the filing date of Singapore Patent Application Serial No. 201309439-6, filed 19 Dec. 2013, which application is hereby incorporated by reference.

BACKGROUND

The present exemplary embodiment relates generally to the field of automation control systems, such as those used in industrial and commercial settings. It finds particular application in conjunction with techniques for providing, accessing, configuring, operating, or interfacing with input/output (I/O) devices that are configured for coupling and interaction with an automation controller, and will be described with particular reference thereto. However, it is to be appreciated that the present exemplary embodiment is also amenable to other like applications.

Automation controllers are special purpose computers used for controlling industrial automation and the like. Under the direction of stored programs, a processor of the automation controller examines a series of inputs (e.g., electrical input signals to the automation controller) reflecting the status of a controlled process and changes outputs (e.g., electrical output signals from the automation controller) based on analysis and logic for affecting control of the controlled process. The stored control programs may be continuously executed in a series of execution cycles, executed periodically, or executed based on events. The inputs received by the automation controller from the controlled process and the outputs transmitted by the automation controller to the controlled process are normally passed through one or more I/O devices, which are components of an automation control system that serve as an electrical interface between the automation controller and the controlled process.

Traditional I/O devices typically include a base configured to couple the I/O device with a bus bar or the like, a terminal block for communicatively coupling the I/O device with field devices, and an I/O module that includes circuitry for performing communication functions and/or logic operations. In operation, a traditional I/O device typically communicatively couples with field devices (e.g., sensors and actuators) via terminals of the terminal block such that the I/O device can receive input signals from the field devices and provide output signals to the field devices.

In many applications, a large number of bases are arranged in close proximity to each other along a bus bar mounted on a wall or other surface. Each base supports both a terminal block and an I/O module. This type of configuration is sometimes referred to as a slice I/O because each set of bases, modules, and terminal blocks appear to be a "slice" of a larger structure. In these compact arrangements, heat generated by the I/O modules can cause performance issues. In the past, either external cooling has been provided, or the devices have been derated to ensure reliable functionality and device longevity. External cooling incurs additional expense, while derating requires additional units and/or space. Therefore, neither approach is ideal.

BRIEF DESCRIPTION

In accordance with one aspect, an input/output (I/O) device comprises a base portion configured to communicatively connect the I/O device with at least one other device, an I/O module physically and communicatively connected to the base portion and comprising I/O communication circuitry and a terminal block mount surface, and a terminal block physically and communicatively connected to the terminal block mount surface of the I/O module. The terminal block mount surface has a width that is greater than a corresponding width of the terminal block such that a portion of the terminal block mount surface extends beyond the terminal block, said portion of the terminal block mount surface extending beyond the terminal block including at least one vent for permitting the flow of air through the I/O module and along the terminal block.

The terminal block mount surface of the I/O module can be an upper surface thereof, and an opposing bottom surface of the I/O module can be engaged with the base portion and can include at least one vent in fluid communication with the at least one vent of the terminal block mount surface, whereby air can circulate through the I/O module and past the terminal block. The input/output (I/O) device can further comprise at least one vent on a front surface of the I/O module, the front surface extending between the upper surface and the bottom surface of the I/O module. The input/output (I/O) device can further comprise at least one connection terminal for connecting the I/O module to an adjacent I/O module. The terminal block can be removably secured to the I/O module. The I/O module can have a width of 15 mm and the terminal block mount surface can have a width coextensive with the width of the I/O module. The terminal block can have a width of 10 mm.

In accordance with another aspect, an input/output (I/O) device assembly comprises a plurality of I/O devices mounted on a rail in abutting engagement with each other, each I/O device comprising a base portion configured to communicatively connect the I/O device with at least one other device, an I/O module physically and communicatively connected to the base portion and comprising I/O communication circuitry and a terminal block mount surface, and a terminal block physically and communicatively connected to the terminal block mount surface of the I/O module, the terminal block mount surface having a width that is greater than a corresponding width of the terminal block such that a portion of the terminal block mount surface extends beyond the terminal block, said portion of the terminal block mount surface extending beyond the terminal block including at least one vent for permitting the flow of air through the I/O module and along the terminal block, wherein an air gap is formed between adjacent I/O devices between respective terminal blocks, said air gap defining a passageway for air to circulate from the I/O module past the respective terminal blocks.

The terminal block mount surface of each I/O module can be an upper surface thereof, and an opposing bottom surface of each I/O module is engaged with the base portion and includes at least one vent in fluid communication with the at least one vent of the terminal block mount surface, whereby air can circulate through each I/O module and past the terminal block. The input/output (I/O) device assembly can further comprise at least one vent on a front surface of each I/O module, the front surface extending between the upper surface and the bottom surface of each I/O module. Each I/O device can further comprise at least one connection terminal for connecting to an adjacent I/O module. The terminal block of each I/O device can be removably secured thereto. Each I/O module can have a width of 15 mm and the terminal block mount surface of each I/O module can have a width coextensive with the width of the I/O module. At least one terminal block can have a width of 10 mm.

In accordance with another aspect, a method of assembling an input/output device assembly comprises mounting first and second I/O modules to a rail, the I/O modules having a common width and in abutting engagement along respective sides thereof, and mounting at least one terminal block to a terminal block mounting surface of at least one of the first or second I/O modules, the terminal block having a width that is less than that of the I/O modules width. The I/O modules can be mounted on respective bases secured to the rail.

DETAILED DESCRIPTION

Figure 1:
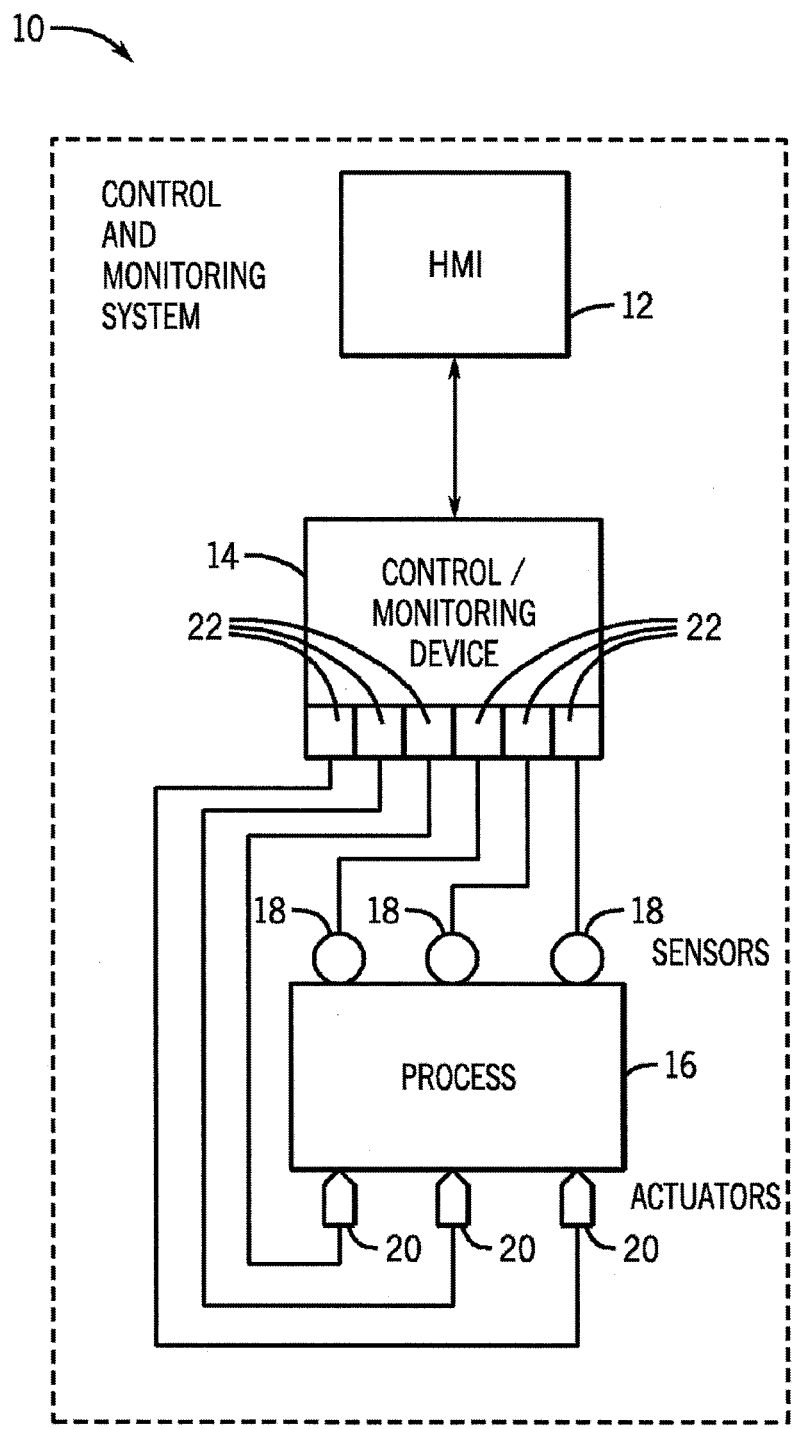
FIG. 1 is a diagrammatical representation of an exemplary control and monitoring system.

FIG. 1 is a diagrammatical representation of an exemplary control and monitoring system adapted to interface with networked components and configuration equipment in accordance with embodiments of the present techniques. The control and monitoring system is generally indicated by reference numeral 10. Specifically, the control and monitoring system 10 is illustrated as including a human machine interface (HMI) 12 and an automation controller or control/monitoring device 14 adapted to interface with components of a process 16.

The process 16 may take many forms and include devices for accomplishing many different and varied purposes. For example, the process 16 may comprise a compressor station, an oil refinery, a batch operation for making food items, a mechanized assembly line, and so forth. Accordingly, the process 16 may comprise a variety of operational components, such as electric motors, valves, actuators, temperature elements, pressure sensors, or a myriad of manufacturing, processing, material handling, and other applications. Further, the process 16 may comprise control and monitoring equipment for regulating process variables through automation and/or observation.

For example, the illustrated process 16 comprises sensors 18 and actuators 20. The sensors 18 may comprise any number of devices adapted to provide information regarding process conditions. The actuators 20 may include any number of devices adapted to perform a mechanical action in response to a signal from a controller (e.g., an automation controller). The sensors 18 and actuators 20 may be utilized to operate process equipment. Indeed, they may be utilized within process loops that are monitored and controlled by the control/monitoring device 14 and/or the HMI 12. Such a process loop may be activated based on process inputs (e.g., input from a sensor 18) or direct operator input received through the HMI 12.

As illustrated, the sensors 18 and actuators 20 are in communication with the control/monitoring device 14 and may be assigned a particular address in the control/monitoring device 14 that is accessible by the HMI 12. As illustrated, the sensors 18 and actuators 20 may communicate with the control/monitoring device 14 via one or more I/O devices 22 coupled to the control/monitoring device 14. The I/O devices 22 may transfer input and output signals between the control/monitoring device 14 and the controlled process 16. The I/O devices 22 may be integrated with the control/monitoring device 14, or may be added or removed via expansion slots, bays or other suitable mechanisms. For example, as described in greater detail below, additional I/O devices 22 may be added to add functionality to the control/monitoring device 14. Indeed, if new sensors 18 or actuators 20 are added to control the process 16, additional I/O devices 22 may be added to accommodate and incorporate the new features functionally with the control/monitoring device 14. The I/O devices 22 serve as an electrical interface to the control/monitoring device 14 and may be located proximate or remote from the control/monitoring device 14, including remote network interfaces to associated systems.

The I/O devices 22 may include input modules that receive signals from input devices such as photo-sensors and proximity switches, output modules that use output signals to energize relays or to start motors, and bidirectional I/O modules, such as motion control modules which can direct motion devices and receive position or speed feedback. In some embodiments, the I/O devices 22 may convert between AC and DC analog signals used by devices on a controlled machine or process and DC logic signals used by the control/monitoring device 14. Additionally, some of the I/O devices 22 may provide digital signals to digital I/O devices and receive digital signals from digital I/O devices. Further, in some embodiments, the I/O devices 22 that are used to control machine devices or process control devices may include local microcomputing capability on an I/O module of the I/O devices 22.

In some embodiments, the I/O devices 22 may be located in close proximity to a portion of the control equipment, and away from the remainder of the control/monitoring device 14. In such embodiments, data may be communicated with remote modules over a common communication link, or network, wherein modules on the network communicate via a standard communications protocol. Many industrial controllers can communicate via network technologies such as Ethernet (e.g., IEEE802.3, TCP/IP, UDP, EtherNet/IP, and so forth), ControlNet, DeviceNet or other network protocols (Foundation Fieldbus (H1 and Fast Ethernet) Modbus TCP, Profibus) and also communicate to higher level computing systems.

Figure 2:
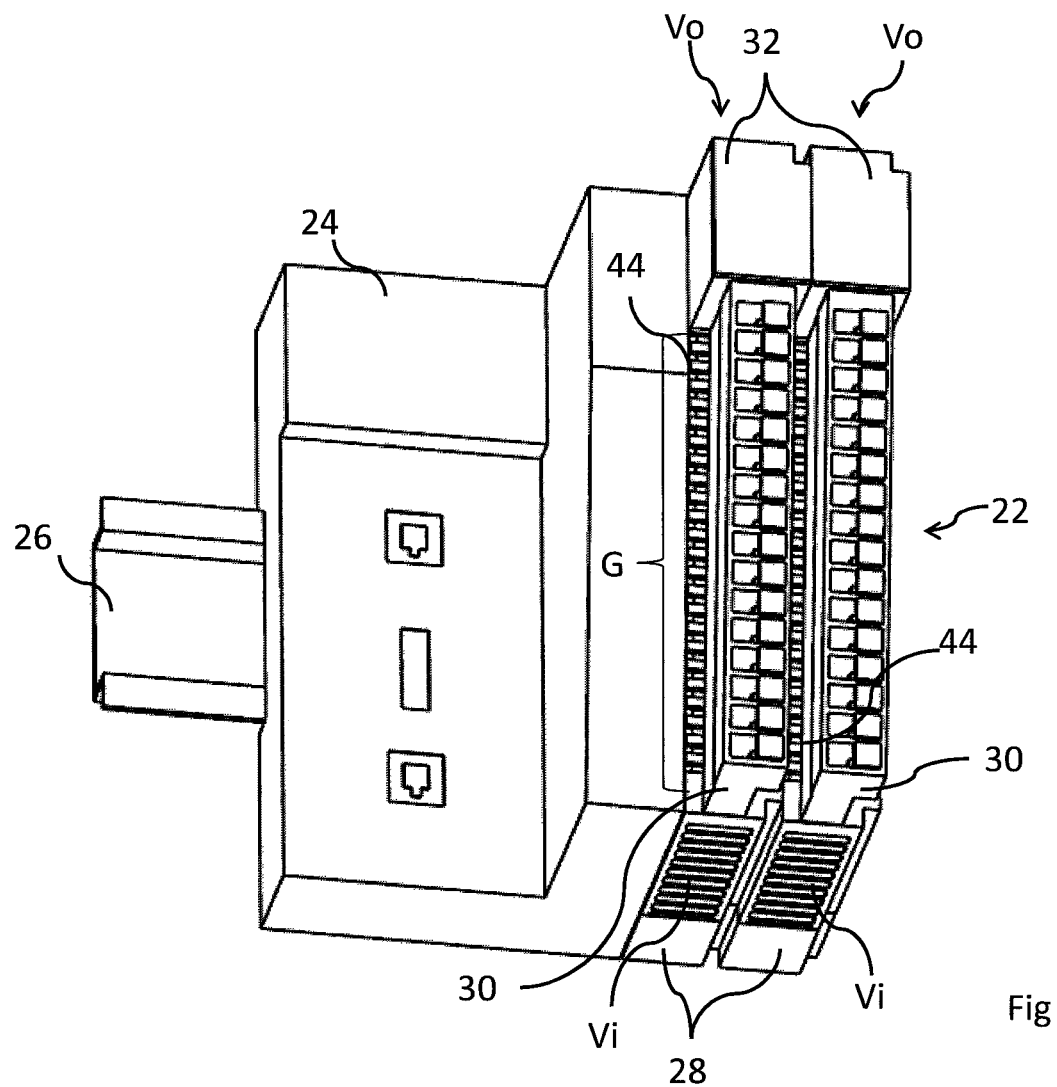
FIG. 2 is a perspective view of an I/O device in accordance with the present disclosure.

FIG. 2 is a perspective view of a plurality of I/O devices 22 connected to an I/O adapter 24 in accordance with embodiments of the present disclosure. Although only two I/O devices 22 are illustrated, it will be appreciated that any number of I/O devices can be used in accordance with the present disclosure. The I/O adapter 24 is configured to provide system power to the I/O modules 22, as well as to enable conversion between the communications protocols of the I/O devices 22 and the control/monitoring device 14. As illustrated, the I/O adapter 24 and the plurality of I/O devices 22 are mounted to a DIN rail 26, which is an industry standard support rail for mounting control equipment in racks and cabinets. The plurality of I/O devices 22 are electrically coupled in series along the DIN rail 26 such that field power and system information and power may be communicated between the I/O devices 22, and back through the I/O adapter 24 to the control/monitoring device 14. In other embodiments, the DIN rail 26 may be replaced with a different type of mounting structure. It will be appreciated that the I/O devices can be used in a wide variety of configurations, and the arrangement illustrated in FIG. 2 is merely exemplary in nature.

Each of the I/O devices 22 includes a base 28 for physically and communicatively connecting the I/O device 22 to the DIN rail 26, the I/O adapter 24 and/or adjacent I/O devices 22. In addition, the base 28 of the I/O device 22 is configured to physically and communicatively connect the I/O device 22 with other I/O devices 22 via the DIN rail 26, field and system electrical contacts as described in greater detail below, base connection features as described in greater detail below, and so forth. In addition, each of the I/O devices 22 includes a terminal block 30 (which, in certain embodiments, may be removable from the base 28) for electrically connecting the I/O device 22 to field devices, such as the sensors 18 and actuators 20 illustrated in FIG. 1. As described in greater detail below, in certain embodiments, each terminal block 30 may include status indicators that are directly aligned with (e.g., adjacent to or directly integrated with) terminals of the terminal block 30. Furthermore, each of the I/O devices 22 includes one or more I/O modules 32, which include I/O control circuitry and/or logic. In general, the I/O modules 32 receive input signals from the field devices, deliver output signals to the field devices, perform general and/or specific local functionality on the inputs and/or outputs, communicate the inputs and/or outputs to the control/monitoring device 14 and/or the other I/O devices 22, and so forth.

Figure 3:
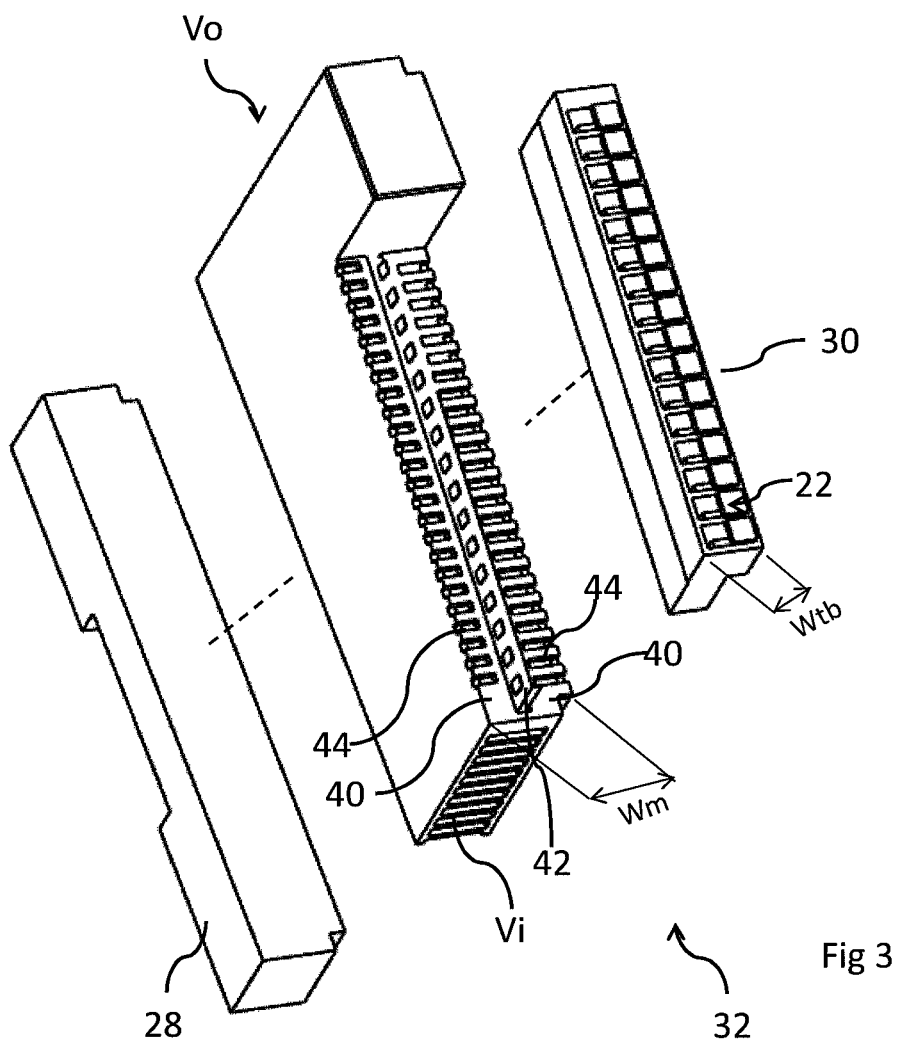
FIG. 3 is an exploded view of an exemplary I/O device in accordance with the present disclosure.
Figure 4:
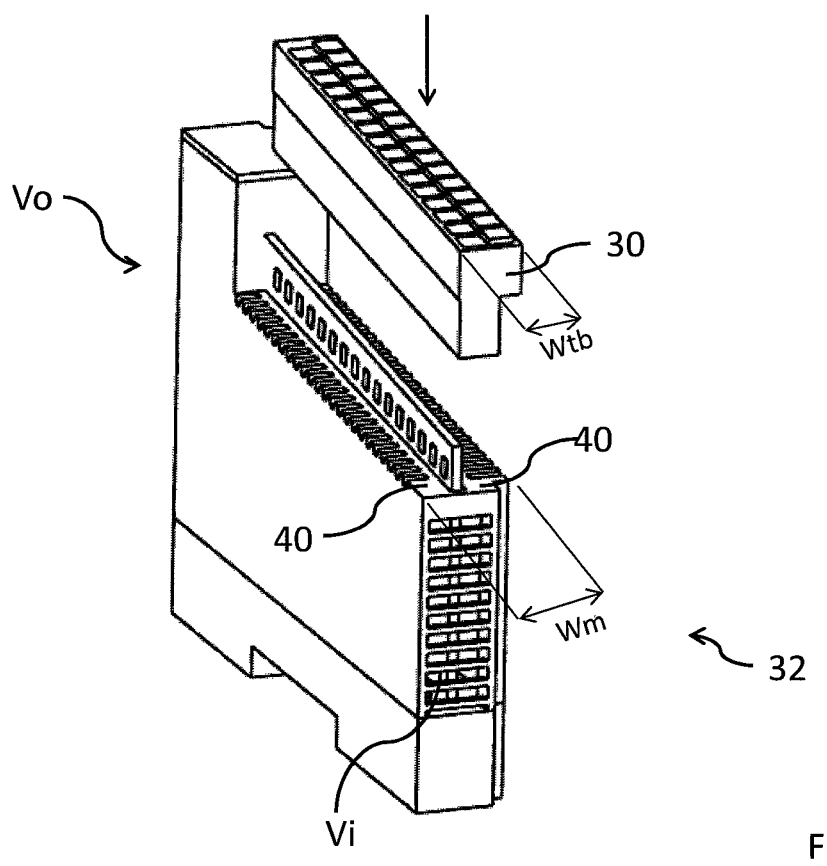
FIG. 4 is a front elevational view of an exemplary I/O module and terminal block in accordance with the present disclosure.

With additional reference to FIGS. 3 and 4, each I/O module 32 includes a terminal block mount surface 40 (e.g., upper surface of the terminal block opposite a bottom surface of the terminal block configured to engage base portion). The terminal block mount surface 40 includes a plurality of connectors 42 for coupling with respective connectors of the terminal block 30, and a plurality of vents, or openings 44 through which air can pass. As illustrated, the terminal block mount surface 40 has a width Wm that is greater than a corresponding width Wtb of the terminal block 30 such that a portion of the terminal block mount surface 40 extends beyond the terminal block 30 when the terminal block 30 is mounted thereto. It will be appreciated that the portion of the terminal block mount surface 40 extending beyond the terminal block 30 includes vents 44 for permitting the flow of air through the I/O module 32 and along the terminal block 30. This is perhaps best seen in FIG. 2, where vents 44 are exposed on each of the I/O devices 22.

In the illustrated embodiment, the width of the terminal block 30 is roughly two-thirds the width of the terminal block mount surface 40. In one exemplary configuration Wtb is approximately 10 mm and Wm is approximately 15 mm. It will be appreciated that other dimensions are also possible, and that the relative width of the terminal block and terminal block mount surface can be different.

It should now be appreciated that the present disclosure sets forth a slice-IO module housing with side ventilation. The air gap formed between adjacent terminal blocks provides an additional path for ambient air to enter the I/O module and hot air to escape from the I/O module.

In operation, a printed circuit board (or other electrical component) inside the module heats up. Heat is transferred to the surrounding air in the module and the surrounding air gets heated up. Convection starts because the hot air in the module rises out of the module via outlet vents Vo, and cooler ambient air enters the module via inlet vents Vi. Vents Vo and Vi are located on front and rear surfaces of the I/O module extending between the upper and lower surfaces. This is the primary way heat from the printed circuit board is removed from the module.

As illustrated in FIG. 2, the narrower terminal block 30 facilitates extra vent openings 44 on the terminal block mount surface. When the I/O modules are assembled together as shown, an additional air gap G is formed along the length of the module. The additional vent openings 44 provide an extra path for additional cooler ambient air to enter the I/O module and for hot air to escape along the I/O module and pass along the terminal block 30. This increased air flow can help manage heat generated by the electrical components of the I/O module.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. An input/output (I/O) device, comprising:
   a base portion configured to communicatively connect the I/O device with at least one other device;
   an I/O module physically and communicatively connected to the base portion and comprising I/O communication circuitry and a terminal block mount surface on an exterior thereof; and
   a terminal block physically and communicatively connected to the terminal block mount surface of the I/O module;
   wherein the terminal block mount surface has a width that is greater than a corresponding width of the terminal block such that a portion of the terminal block mount surface extends beyond the terminal block, said portion of the terminal block mount surface extending beyond the terminal block including at least one vent extending from an interior of the I/O module to the exterior of the I/O module for permitting the flow of air through the I/O module and along the terminal block; and
   wherein the terminal block mount surface of the I/O module is an upper surface thereof, and wherein an opposing bottom surface of the I/O module is engaged with the base portion, and wherein a front surface extends between the upper surface and the bottom surface of the I/O module and includes at least one vent in fluid communication with the at least one vent of the terminal block mount surface, whereby air can circulate through the I/O module and past the terminal block.

2. The input/output (I/O) device of claim 1, further comprising at least one vent on a back surface of the I/O module, the back surface extending between the upper surface and the bottom surface of the I/O module.

3. The input/output (I/O) device of claim 1, further comprising at least one connection terminal for connecting the I/O module to an adjacent I/O module.

4. The input/output (I/O) device of claim 1, wherein the terminal block is removably secured to the I/O module.

5. The input/output (I/O) device of claim 1, wherein the I/O module has a width of 15 mm and the terminal block mount surface having a width coextensive with the width of the I/O module.

6. The input/output (I/O) device of claim 5, wherein the terminal block has a width of 10 mm.

7. An input/output (I/O) device assembly comprising a plurality of I/O devices mounted on a rail in abutting engagement with each other, each I/O device comprising a base portion configured to communicatively connect the I/O device with at least one other device, an I/O module physically and communicatively connected to the base portion and comprising I/O communication circuitry and a terminal block mount surface, and a terminal block physically and communicatively connected to the terminal block mount surface of the I/O module, the terminal block mount surface having a width that is greater than a corresponding width of the terminal block such that a portion of the terminal block mount surface extends beyond the terminal block, said portion of the terminal block mount surface extending beyond the terminal block including at least one vent including a passageway extending from an interior of the I/O module containing the I/O communication circuitry to an exterior of the I/O module for permitting the flow of air through the I/O module and along the terminal block, wherein an air gap is formed between adjacent I/O devices between respective terminal blocks, said air gap defining a passageway for air to circulate from the I/O module past the respective terminal blocks, and wherein the terminal block mount surface of the I/O module is an upper surface thereof, and wherein an opposing bottom surface of the I/O module is engaged with the base portion, and wherein a front surface extends between the upper surface and the bottom surface of the I/O module and includes at least one vent in fluid communication with the at least one vent of the terminal block mount surface, whereby air can circulate through the I/O module and past the terminal block.

8. The input/output (I/O) device assembly of claim 7, further comprising at least one vent on a back surface of each I/O module, the back surface extending between the upper surface and the bottom surface of each I/O module.

9. The input/output (I/O) device assembly of claim 7, wherein each I/O device further comprises at least one connection terminal for connecting to an adjacent I/O module.

10. The input/output (I/O) device assembly of claim 7, wherein the terminal block of each I/O device is removably secured thereto.

11. The input/output (I/O) device assembly of claim 7, wherein each I/O module has a width of 15 mm and the terminal block mount surface of each 110 module has a width coextensive with the width of the I/O module.

12. The input/output (I/O) device assembly of claim 11, wherein at least one terminal block has a width of 10 mm.

* * * * *